United States Patent
Takala et al.

(10) Patent No.: US 6,494,252 B1
(45) Date of Patent: Dec. 17, 2002

(54) ELECTRONICS CABINET AND AIR CHANNEL SYSTEM FOR AN ELECTRONICS CABINET

(75) Inventors: Roope Takala, Espoo (FI); Petri Uusitalo, Oula (FI); Malcolm Perry, Stockbridge (GB)

(73) Assignee: Nokia Networks Oy, Espoo (FI)

(*) Notice: Subject to any disclaimer, the term of this patent is extended or adjusted under 35 U.S.C. 154(b) by 0 days.

(21) Appl. No.: 09/540,804

(22) Filed: Mar. 31, 2000

(Under 37 CFR 1.47)

Related U.S. Application Data

(63) Continuation of application No. PCT/FI98/00742, filed on Sep. 22, 1998.

(30) Foreign Application Priority Data

Oct. 3, 1997 (FI) .................................. 973881

(51) Int. Cl.[7] ................................................ H05K 5/00
(52) U.S. Cl. ............................... 165/104.33; 165/80.3; 165/104.34; 361/696
(58) Field of Search ...................... 454/184; 361/696; 165/80.3, 104.33, 104.34

(56) References Cited

U.S. PATENT DOCUMENTS

| | | | |
|---|---|---|---|
| 3,559,728 A | * | 2/1971 | Lyman |
| 3,768,553 A | * | 10/1973 | Sollich |
| 4,386,651 A | | 6/1983 | Reinhard |
| 4,507,940 A | * | 4/1985 | Sato et al. .................. 165/122 |
| 5,035,281 A | * | 7/1991 | Neuenfeldt et al. . 165/104.34 X |
| 5,085,057 A | * | 2/1992 | Thompson et al. ......... 165/135 |
| 5,467,250 A | | 11/1995 | Howard et al. |
| 5,603,376 A | * | 2/1997 | Hendrix .................. 165/104.34 |
| 5,644,472 A | | 7/1997 | Klein |
| 5,907,473 A | * | 5/1999 | Prizilas et al. |
| 6,026,891 A | * | 2/2000 | Fujiyoshi et al. ...... 165/104.33 |
| 6,170,562 B1 | * | 1/2001 | Knoblauch ............. 165/104.33 |

FOREIGN PATENT DOCUMENTS

| | | |
|---|---|---|
| DE | 34 08 139 | 9/1985 |
| DK | 157649 | 2/1984 |
| EP | 0 515 329 | 11/1992 |
| FR | 2 078 558 | 10/1971 |
| GB | 2 277 767 | 11/1994 |
| WO | 97/24911 | 7/1997 |

OTHER PUBLICATIONS

International Search Report for PCT/FI98/00742, Mar. 2, 1999.

"Acoustic Baffle" *IBM Technical Disclosure Bulletin*, vol. 28, No. 6, pp. 2621–2622, Nov. 1985.

* cited by examiner

*Primary Examiner*—Harold Joyce
(74) *Attorney, Agent, or Firm*—Altera Law Group, LLP

(57) ABSTRACT

Electronics cabinet comprising an enclosure (1) with an interior space (2) where electronic parts, such as circuit cards and the like, can be mounted, and a cooling system (3) arranged as a substantially integral assembly with the enclosure in the immediate vicinity of its interior space for cooling the interior space. The cooling system (3) comprises means for internal air circulation within the interior space, for conveying an external air circulation separated from the internal air circulation into and out of the cooling system and for cooling the air in the internal circulation. The means for conveying the internal and/or external air circulation comprise a body (4) made from a foamed material with a flow channel (5, 6, 7) formed in it, through which at least part of the internal and/or external air circulation is passed.

9 Claims, 4 Drawing Sheets

ELECTRONICS CABINET AND AIR CHANNEL SYSTEM FOR AN ELECTRONICS CABINET

This application is a continuation of international application serial number PCT/FI98/00742, filed Sep. 22, 1998.

BACKGROUND OF THE INVENTION

1. Field of the Invention

The present invention relates to an electronics cabinet for use in outdoor locations in a telecommunications system as disclosed herein. Moreover, the invention relates to an air channel system for an electronics cabinet formed in a body as disclosed herein.

2. Description of Related Art

In prior art, an electronics cabinet is known which comprises an enclosure with an interior space where electronic parts, such as circuit cards and the like, can be mounted. The cabinet is also provided with a cooling system for cooling the space inside the cabinet. The cooling system is an integral assembly attached to the enclosure in the immediate vicinity of its interior space. The cooling system comprises means for internal air circulation within the interior space, for conveying an external air circulation separated from the internal air circulation into and out of the cooling system and for cooling the internal circulation air by means of the external air circulation. In this prior-art electronics cabinet, the means for conveying the air consist of a complex sheet metal structure comprising several bent sheet metal parts, in which the air flow channels are formed from a large number of bent sheet metal parts joined together. To damp the noise generated by the air flow, the sheet metal structure is additionally lined with foamed plastic panels. A problem with this prior-art structure is that its manufacturing costs are very high due to the complexity of the structure.

SUMMARY OF THE INVENTION

The object of the present invention is to eliminate the drawbacks mentioned above.

A specific object of the invention is to present an electronics cabinet and an air channel system for the cabinet that are simple in structure as well as cheap and allow easy assembly of the unit.

The electronics cabinet of the invention includes an enclosure with an interior space where electronic parts can be mounted. The air channel system for an electronics cabinet according to the invention is formed in a body and made of a foamed material.

The electronics cabinet of the invention comprises an enclosure with an interior space where electronic parts, such as circuit cards and the like, can be mounted, and a cooling system implemented as a substantially integral assembly with the enclosure and disposed in the immediate vicinity of the interior space for cooling said space. The cooling system comprises means for internal air circulation within the interior space, for conveying an external air circulation separated from the internal air circulation into and out of the cooling system and for cooling the air in the internal circulation by means of the external air circulation.

According to the invention, the means for conveying the internal and/or external air circulation comprise a body made from foamed material with a flow channel formed in it, through which at least part of the internal and/or external air circulation is passed.

The invention provides the advantage that the air channel system is simpler and considerably cheaper than earlier systems. Assembling the electronics cabinet becomes easier because the number of parts and holding fixtures is smaller than before. Moreover, the noise generated by fans and air flow can be effectively damped because the vibrations are effectively damped by the foamed plastic material.

In an embodiment of the electronics cabinet, the body made of foamed material is a body of foamed plastic.

In an embodiment of the electronics cabinet, the cooling system comprises an exterior wall, a first partition wall placed at a distance from the exterior wall and substantially parallel with it; side walls which, together with the exterior wall and the first partition wall, form a hollow first interspace, into which the body has been fitted; a first opening in the exterior wall, a second opening in the first partition wall; and an inlet flow channel in the body, serving to convey external air from the first opening into the second opening.

In an embodiment of the electronics cabinet, the cooling system comprises a second partition wall, which is located at a distance from the first partition wall and is substantially parallel with it and, together with the first partition wall and the side walls, delimits a hollow second interspace and separates the cooling system from the interior cabinet space containing electronic parts to be cooled. The second partition wall is provided with a third opening. Further, an air-to-air heat exchanger is provided in the second interspace. The heat exchanger divides the second interspace into four sub-spaces. The first and the second sub-spaces are for external air circulation and are located on opposite sides of the heat exchanger. The third and the fourth sub-spaces are for internal air circulation and are correspondingly located on opposite sides of the heat exchanger. An external-air fan for creating an external air circulation is placed in a cut-out, opening or the like formed in the body in the area of the second sub-space and constituting an exit channel for conveying the external air flow out of the cabinet. On the suction side, the external-air fan has been arranged to produce suction to draw the external air flow through the first opening, the inlet flow channel and the second opening into the first sub-space and further through the heat exchanger into the second sub-space. From the second sub-space, the air flow is passed further via the third opening in the first partition wall through the external-air fan, from where it is blown out of the cabinet through the outlet channel in the body.

In an embodiment of the electronics cabinet, the second partition wall comprises a fourth opening, which is located in the area of the third sub-space for passing internal air from the interior space into the third sub-space, and a fifth opening, which is located in the area of the fourth sub-space. The cooling system comprises a internal-air fan, which is disposed in the area of the fifth opening. The internal-air fan has been arranged to circulate the internal air from the interior space of the cabinet through the fourth opening into the third sub-space and further through the heat exchanger into the fourth sub-space and further via the fifth opening to the pressure side of the internal-air fan and back into the interior space.

In an embodiment of the electronics cabinet, the cooling system comprises air blow channels arranged to convey the cooled internal air blow from the internal-air fan into the interior space, between the electronic parts, such as electronic circuit cards.

In an embodiment of the electronics cabinet, the size of the body has been fitted to equal the size of the first interspace so as to fill substantially the entire first interspace.

In an embodiment of the electronics cabinet, the size of the body has been fitted to be smaller than the first interspace so as to leave some space for passing an air flow between the body and the walls delimiting the first interspace.

In an embodiment of the electronics cabinet, the electronics cabinet is a cabinet designed for use in outdoor locations, e.g. as an enclosure for a base transceiver station comprised in a wireless telecommunication system.

BRIEF DESCRIPTION OF THE DRAWINGS

In the following, the invention will be described in detail by the aid of a few examples of its embodiments by referring to the attached drawings, wherein.

DETAILED DESCRIPTION OF THE INVENTION

Figure 1:
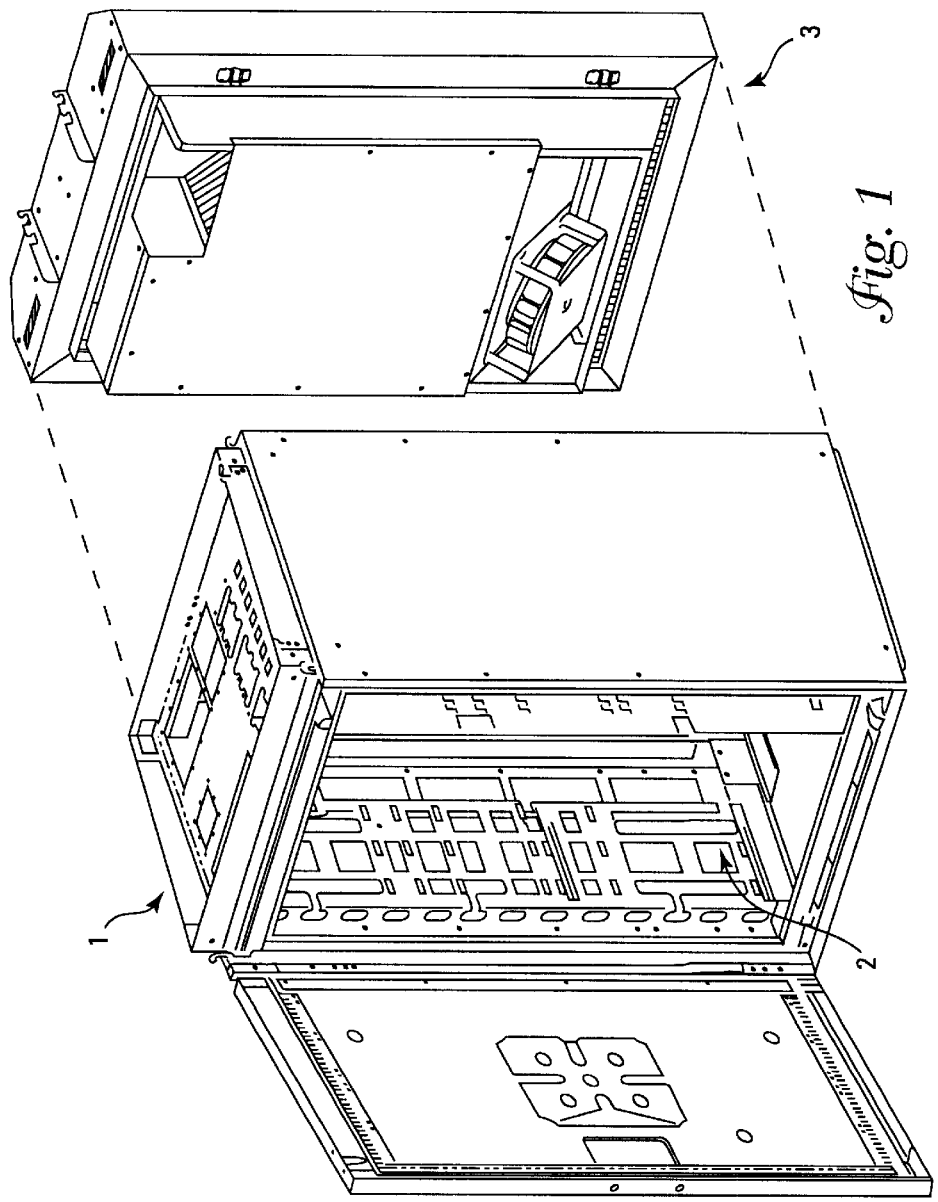
FIG. 1 presents an axonometric oblique top view of an embodiment of the electronics cabinet of the invention, with the enclosure and the cooling system shown in separation from each other.

FIG. 1 shows an electronics cabinet, which in this example is an enclosure for a base transceiver station comprised in a wireless telecommunication system, designed for use in outdoor locations. Such an outdoor base station cabinet is exposed to weather, so it has to be of a tight structure. The electronics housed in the cabinet develops a fairly high temperature, e.g. as high as 90° C., in the interior space of the cabinet, which is cooled by means of an air cooling system 3. The figure shows an enclosure 1 with an interior space 2 where electronic parts, such as circuit cards and the like, can be mounted, and a cooling system 3, which can be installed as a compact unit in conjunction with the enclosure 1 so that it simultaneously forms a back wall.

Figure 2:
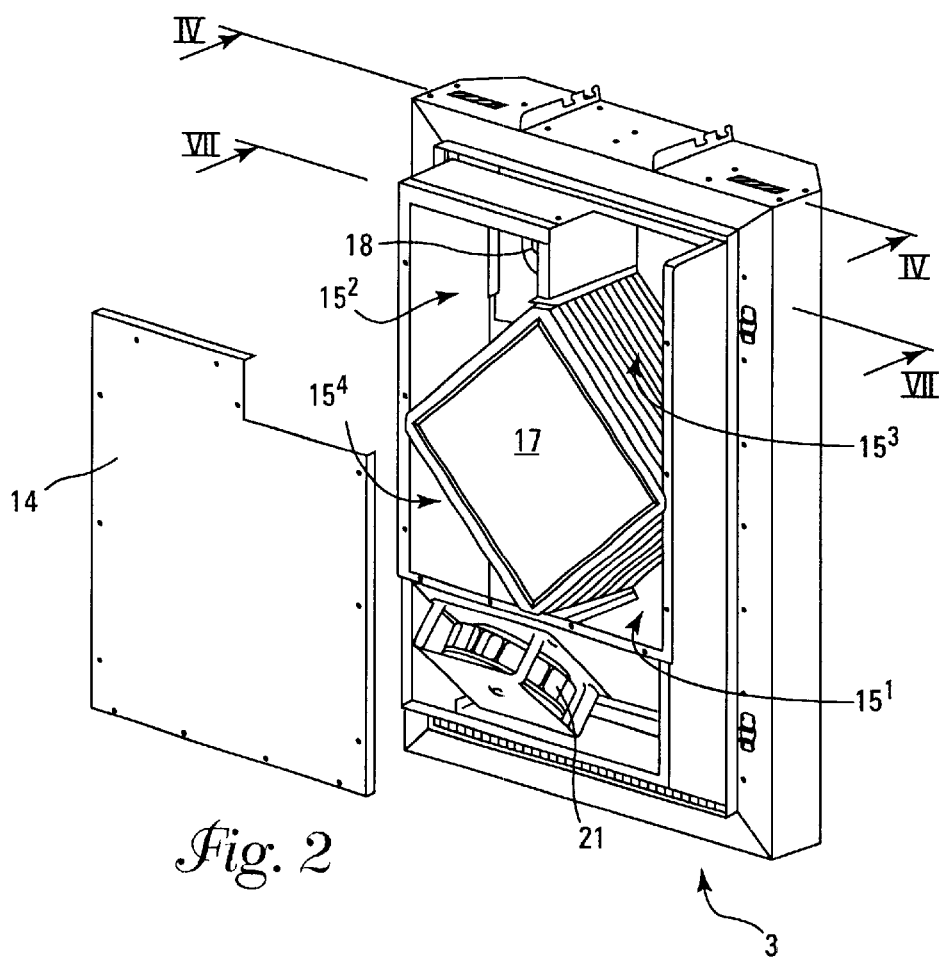
FIG. 2 presents the cooling system part of the embodiment in FIG. 1, with the second partition wall, which covers the second interspace containing the heat exchanger, removed.

The cooling system 3 comprises means for circulating air as a closed internal air circulation within the interior space. Moreover, the cooling system comprises means for passing an open external air circulation separated from the internal air circulation into and out of the cooling system. The air circulated within the interior space is cooled by the external air circulation. The exchange of heat between the internal and the external air circulation systems is effected using an air-to-air heat exchanger 17 as shown in FIG. 2. The external air circulation has been described above by referring to FIGS. 4–6, and the internal air circulation has been described by referring to FIGS. 7 and 8.

Figure 3:
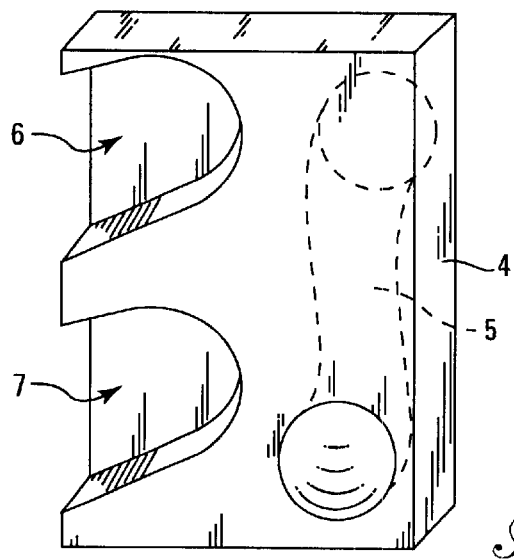
FIG. 3 presents an embodiment of the air channel system of the electronics cabinet of the invention, formed from a foamed plastic body.

FIG. 3 presents a foamed plastic body 4 formed from a single solid piece of foamed plastic material, containing flow channels 5, 6, 7, through which some of the external air circulation is conveyed. The foamed plastic body 4 is mounted inside the cooling system enclosure 3 as described below. The foamed plastic body 4 can be produced from plastic foam e.g. by the injection moulding method using one or two moulds.

Figure 4:
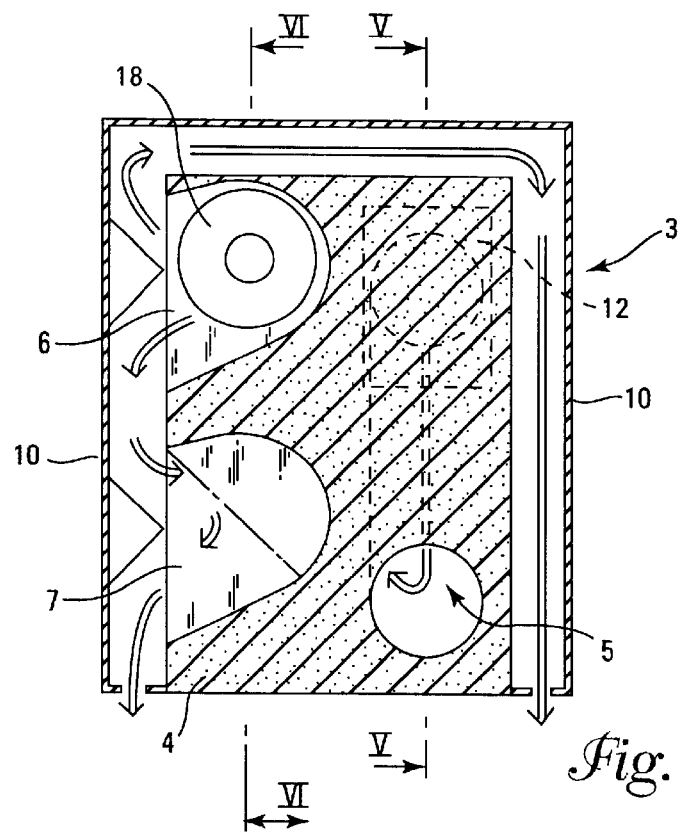
FIG. 4 presents section IV—IV of FIG. 2.
Figure 5:
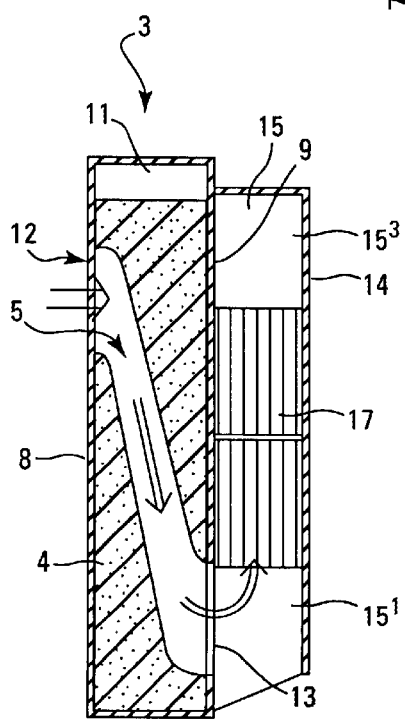
FIG. 5 presents section V—V of FIG. 4.
Figure 6:
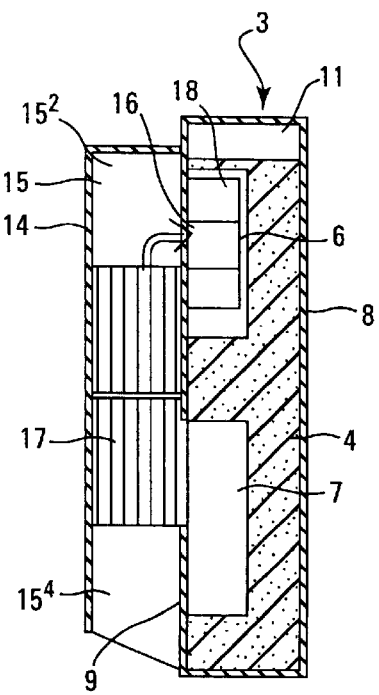
FIG. 6 presents section VI—VI of FIG. 4.

As shown in FIGS. 4–6, the cooling system part 3 comprises an exterior wall 8, a first partition wall 9, which is placed at a distance from the exterior wall and substantially parallel with it, and side walls 10, which, together with the exterior wall 8 and the first partition wall 9, form a hollow first interspace 11. The foamed plastic body 4 presented in FIG. 3 is mounted in this interspace 11. The size of the foamed plastic body 4 has been fitted to be smaller than the first interspace 11 so as to leave a space for passing the external air flow between the foamed plastic body 4 and the walls delimiting the first interspace 11.

As shown in FIG. 5, the exterior wall 8 has a first opening 12. The first partition wall 9 has a second opening 13. The foamed plastic body 4 contains an external air inlet channel 5 for conveying external air from the first opening 12 into the second opening 13.

The second partition wall 14 is located at a distance from the first partition wall 9 and is substantially parallel with it. Together with the first partition wall 9 and the side walls, the second partition wall 14 delimits a hollow second interspace 15. In addition, the second partition wall 14 separates the cooling system 3 from the interior cabinet space 2, which contains electronic parts to be cooled. The second partition wall 14 has a third opening 16.

An air-to-air heat exchanger 17 has been fitted in the second interspace 15. The heat exchanger 17 divides the second interspace into four sub-spaces $15^1$, $15^2$, $15^3$, $15^4$. The first sub-space $15^1$ and the second sub-space $15^2$ are for external air circulation and are located on opposite sides of the heat exchanger 17. The first sub-space $15^1$ and the second sub-space $15^2$ communicate with each other through the heat exchanger 17. The third sub-space $15^3$ and the fourth sub-space $15^4$ are for internal air circulation and are correspondingly located on opposite sides of the -heat exchanger 17. The third sub-space $15^3$ and the fourth sub-space $15^4$ communicate with each other through the heat exchanger 17.

An external-air fan 18 creates an external air circulation. The external-air fan 18 is placed in a cut-out 6 formed in the foamed plastic body 4 in the area of the second sub-space $15^2$. The cut-out constitutes an exit channel for conveying the external air flow out of the cabinet.

Referring to FIGS. 4–5, the external air flow passes through the cooling system 3 as follows. The external-air fan 18 sucks air from outside through the first opening 12, the inlet flow channel 5 and the second opening 13 into the first sub-space $15^1$ and further through the heat exchanger 17 into the second sub-space $15^2$, and from there further via the third opening 16 in the first partition wall 9 through the external-air fan 18 to the pressure side, from where the air is blown out of the cabinet through the outlet channels 6, 7 in the foamed plastic body 4. As shown in FIG. 4, the external air is passed out via two routes, by the top of the foamed plastic body 4 and by its sides. The left-hand flow route has been given a winding shape to ensure that the same flow resistance prevails in both outflow routes and to create a sufficient counterpressure for the fan 18.

Figure 8:
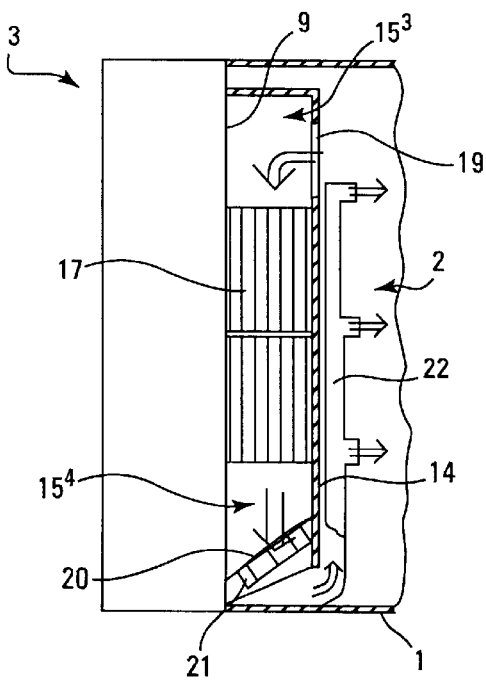
FIG. 8 presents partial section VIII—VIII of FIG. 7.

As is best visible from FIGS. 1 and 8, the second partition wall 14 has a fourth opening 19, which is located in the area of the third sub-space $15^3$ so that the internal air can flow from the interior space 2 into the third sub-space $15^3$. Located on the opposite side of the heat exchanger 17 in the area of the fourth sub-space $15^4$ is a fifth opening 20. An internal-air fan 21 is disposed in the area of the fifth opening 20.

Figure 7:
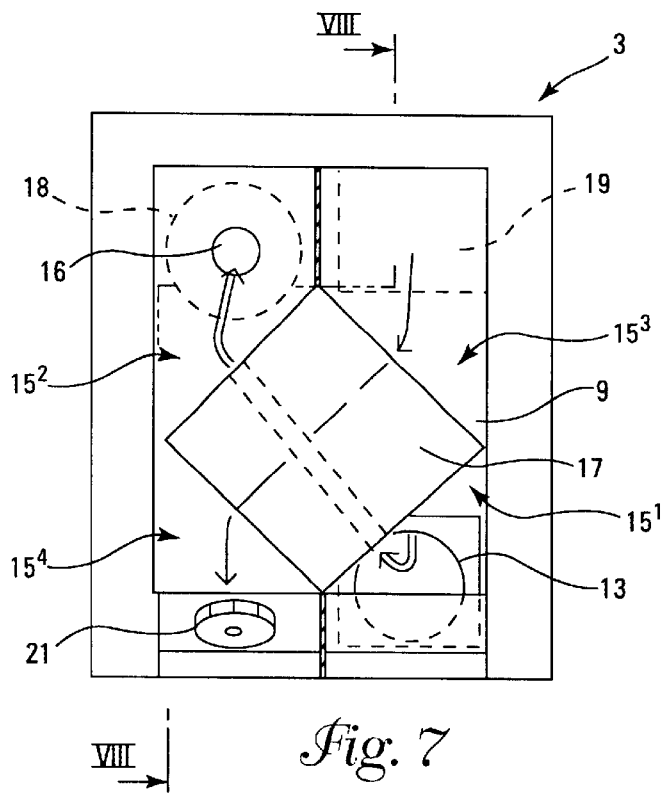
FIG. 7 presents section VII—VII of FIG. 2.

As illustrated by FIGS. 7 and 8, the internal air circulation functions as follows. The internal-air fan 21 circulates the internal air from the interior space 2 of the cabinet through the fourth opening 19 into the third sub-space $15^3$, from where the internal air flows through the heat exchanger 17. In the heat exchanger, the internal air delivers heat into the external air circulation and is cooled. The air then flows into the fourth sub-space $15^4$, from where it passes further via the fifth opening 20 through the internal-air fan 21, and the fan 21 blows it back into the interior space 2 of the cabinet via blow channels 22. The blow channels 22 convey the cooled internal air flow from the internal-air fan 21 into the interior space 2, between the electronic parts, such as electronic circuit cards, placed in said space 2.

The invention is not restricted to the examples of its embodiments described above, but many variations are possible within the scope of the inventive idea defined by the claims.

What is claimed is:

1. Electronics cabinet for use in outdoor locations in a telecommunication system, the cabinet comprising an enclosure with an interior space where electronic parts, can be mounted, and a cooling system arranged as a substantially integral assembly with the enclosure in the immediate vicinity of its interior space for cooling the interior space, said cooling system comprising means for internal air circulation within the interior space, for conveying an external air circulation separated from the internal air circulation into and out of the cooling system and for cooling the air in the internal circulation by means of the external air circulation, wherein the means for conveying the external air circulation comprise a body made from foamed material with a flow channel formed in it, through which at least part of the external air circulation is passed.

2. Cabinet as defined in claim 1, wherein said body has been formed from foamed plastic.

3. Cabinet as defined in claim 1, wherein the cooling system comprises an exterior wall; a first partition wall, placed at a distance from the exterior wall and substantially parallel with it; side walls which, together with the exterior wall and the first partition wall, form a hollow first interspace, into which said body has been fitted; a first opening in the exterior wall; a second opening in the first partition wall; and an inlet flow channel in said body, serving to convey external air from the first opening into the second opening.

4. Cabinet as defined in claim 3, wherein the cooling system comprises a second partition wall, which is located at a distance from the first partition wall and is substantially parallel with it and, together with the first partition wall and the side walls, delimits a hollow second interspace and separates the cooling system from the interior cabinet space containing electronic parts to be cooled, said first partition wall being provided with a third opening; an air-to-air heat exchanger disposed in the second interspace and dividing the second interspace into four sub-spaces, of which the first sub-space and the second sub-space are for external air circulation and are located on opposite sides of the heat exchanger while the third sub-space and the fourth sub-space are for internal air circulation and are correspondingly located on opposite sides of the heat exchanger; and an external-air fan for creating an external air circulation, said fan being placed in a cut-out, opening or the like formed in said body in the area of the second sub-space and constituting an exit channel for conveying the external air flow out of the cabinet, in which system the external-air fan has been arranged to produce suction creating an external air flow through the first opening, the inlet flow channel and the second opening into the first sub-space and further through the heat exchanger into the second sub-space, and from there further via the third opening in the first partition wall through the external-air fan to the pressure side to blow the external air flow out of the cabinet through the outlet channel in said body.

5. Cabinet as defined in claim 4, wherein the second partition wall comprises a fourth opening, which is located in the area of the third sub-space for passing internal air from the interior space into the third sub-space, and a fifth opening, which is located in the area of the fourth sub-space; and that the cooling system comprises a internal-air fan disposed in the area of the fifth opening the internal-air fan being arranged to circulate the internal air from the interior space of the cabinet through the fourth opening into the third sub-space and further through the heat exchanger into the fourth sub-space and from there further via the fifth opening to the pressure side of the internal-air fan and back into the interior space.

6. Cabinet as defined in claim 1, wherein the cooling system comprises an air blow channel arranged to convey the cooled internal air blow from the internal-air fan into the interior space, between the electronic parts, such as electronic circuit cards.

7. Cabinet as defined in claim 1, wherein the size of said body has been fitted to equal the size of the first interspace so as to fill substantially the entire first interspace.

8. Cabinet as defined in claim 1, wherein the size of said body has been fitted to be smaller than the first interspace so as to leave some space for passing an air flow between the body and the walls delimiting the first interspace.

9. Cabinet as defined in claim 1, wherein the electronics cabinet is an enclosure for a base transceiver station comprised in a wireless telecommunication system.

* * * * *